United States Patent
Scholl

(10) Patent No.: US 7,111,263 B2
(45) Date of Patent: Sep. 19, 2006

(54) PROCESS FOR DESIGNING AND MANUFACTURING SEMI-CONDUCTOR MEMORY COMPONENTS, IN PARTICULAR DRAM COMPONENTS

(75) Inventor: Stefan Scholl, Munich (DE)

(73) Assignee: Infineon Technologies AG., Munich (DE)

( * ) Notice: Subject to any disclaimer, the term of this patent is extended or adjusted under 35 U.S.C. 154(b) by 249 days.

(21) Appl. No.: 10/668,684

(22) Filed: Sep. 23, 2003

(65) Prior Publication Data

US 2004/0128628 A1 Jul. 1, 2004

(30) Foreign Application Priority Data

Sep. 26, 2002 (DE) .............................. 102 45 037

(51) Int. Cl.
G06F 17/50 (2006.01)
(52) U.S. Cl. .................... 716/8; 716/9; 716/10; 716/11
(58) Field of Classification Search ............... 716/8–11
See application file for complete search history.

(56) References Cited

U.S. PATENT DOCUMENTS

| | | | | |
|---|---|---|---|---|
| 5,349,552 A | | 9/1994 | Zampaglione ............... 365/51 |
| 5,440,720 A | | 8/1995 | Baisuck et al. ............. 395/500 |
| 5,513,135 A | * | 4/1996 | Dell et al. .................... 365/52 |
| 5,603,043 A | * | 2/1997 | Taylor et al. ................... 712/1 |
| 5,838,603 A | * | 11/1998 | Mori et al. ..................... 365/63 |
| 5,883,814 A | * | 3/1999 | Luk et al. ....................... 716/2 |
| 5,901,304 A | * | 5/1999 | Hwang et al. ................. 716/1 |
| 6,310,815 B1 | * | 10/2001 | Yamagata et al. ..... 365/230.03 |
| 6,335,901 B1 | * | 1/2002 | Morita et al. ............... 365/233 |
| 6,370,677 B1 | | 4/2002 | Carruthers et al. ........... 716/8 |
| 6,556,503 B1 | * | 4/2003 | Schreck ................. 365/230.06 |
| 6,584,604 B1 | * | 6/2003 | Inada ............................. 716/8 |
| 6,807,650 B1 | * | 10/2004 | Lamb et al. ................... 716/1 |

FOREIGN PATENT DOCUMENTS

DE 196 31 905 10/1997

* cited by examiner

Primary Examiner—Vuthe Siek
Assistant Examiner—Naum B. Levin
(74) Attorney, Agent, or Firm—Marshall, Gerstein & Borun LLP

(57) ABSTRACT

The invention relates to a process for designing semi-conductor memory components, especially DRAM components, whereby the process comprises the following steps: designing a first layout for a module of the semi-conductor memory component to be used in a first configuration of the semi-conductor memory component; designing a second layout for the semi-conductor memory component module to be used in a second configuration of the semi-conductor memory component; and using the first layout or the second layout for the total layout of the semi-conductor memory component, depending on the current configuration of the semi-conductor memory component.

14 Claims, 4 Drawing Sheets

PROCESS FOR DESIGNING AND MANUFACTURING SEMI-CONDUCTOR MEMORY COMPONENTS, IN PARTICULAR DRAM COMPONENTS

FIELD

The invention involves a process for designing, and a process for manufacturing semi-conductor memory components, in particular DRAM components.

BACKGROUND

In semi-conductor memory components a distinction is made between so-called functional memory components (i.e. PLAs, PALs, etc.), and so-called tab memory components, i.e. ROM components (ROM=Read Only Memory), and RAM components (RAM=Random Access Memory).

A RAM component is a memory device in which data is stored under a specified address, from which the data can be read out again.

Because a RAM component needs to be provided with as many storage cells as possible, it becomes important for the creation of these cells to be kept as simple as possible. With so-called SRAMs (SRAM=Static Random Access Memory) the individual memory cells for instance consist of a few, e.g. six transistors; and in so-called DRAMs (DRAM=Dynamic Random Access Memory) of only a single suitably controlled capacitance (i.e. the gate source capacitance of a MOSFET), with which in form of a charge one bit at a time can be stored. This charge only persists for a short period of time, which means that a so-called "refresh" must be per-formed regularly, i.e. ca. every 64 ms.

With DRAM components one can distinguish between so-called SDR-DRAMs, and so-called DDR-DRAMs and/or DDR2-DRAMs. In SDR-DRAMs (SDR-DRAM=Single Date Rate DRAM) the data in the component is always only relayed with the ascending pulse flank of a corresponding pulse (clock) signal (or alternatively only with the descending pulse flank).

With DDR-DRAM components (DDR-DRAM=Double Data Rate DRAM), or with their corresponding successive standard "DDR2" components, the data is relayed with the ascending flank of a corresponding pulse (clock) signal as well as with the descending flank of the corresponding pulse (clock) signal.

This means that data is relayed more frequently and/or faster in a DDR-DRAM (and/or a DDR2-DRAM), in particular twice as frequently and/or twice as fast, than in an SDR-DRAM.

Due to their increased integration density and functionality, the design of RAMs, especially DRAM components, has become ever more complex.

Due to this complexity of the components, a structured— i.e. a "top down", "bottom up" or similar conventional approach to design—has become necessary.

In a top down approach for instance, the design of a particular component starts at a relatively high level of abstraction whereafter the relevant design is progressively refined at increasingly lower levels of abstraction (e.g. according to the procedure suggested by D. Gajski in "Introduction to Silicon Compilation", Reading (Mass.), (illustrated in FIG. 4)—from a functional point of view—by starting at a "systems level", proceeding via an "algorithm register transfer and/or logic level" to a "circuit level" etc., or—from a structural point of view—by starting at a "CPU—and/or memory level", proceeding via a sub-system module gate level to a "transistor level", etc.), until finally the mask data required for manufacturing the components is obtained.

Thereby appropriate tests and/or simulations corresponding with each design stage take place (at every level of abstraction); in case of faults the design result must then be modified, and/or the corresponding design step repeated, or the design started anew at a higher level.

This procedure is able to ensure—despite the increased component complexity due to higher integration density and increased functionality—that the designed component operates in a fault-free fashion.

The complexity of DRAM components may for example be even further increased when a particular component is made "variably configurable" during its design (i.e. optionally configurable as an SDR-DRAM, DDR-DRAM or DDR2-DRAM, and/or as a component with 8 or 16 bit data output, and/or as a component with or without special optional features, i.e. with or without power-saving mode, etc.).

The actual configuration of the DRAM component (i.e. as SDR, DDR or DDR2-DRAM, etc.) is then done by means of so-called fuses or bonds—according to the customer's needs—after the DRAM components have been manufactured.

In this way the customer's needs can be met shortly before the component is dispatched, i.e. it can be custom configured by means of the above fuses or bonds.

At the same time, the circuitry not required for the configuration that is finally installed (but still required for the non-installed configurations) create further increased component complexity.

SUMMARY

The invention is aimed at making available a novel process for designing and a novel process for manufacturing semi-conductor memory components, in particular DRAM components.

These and other aims are achieved by means of the subject matter of claims 1 and 6.

Further advantageous features of the invention are listed in the subclaims.

According to a basic concept of the invention, a process for designing, and a process for manufacturing semi-conductor memory components, in particular DRAM components, is provided in which the design and/or manufacturing process comprises the steps:

- the design of a first layout for a module of the semi-conductor memory component to be used in a first configuration of the semi-conductor memory component;
- the design of a second layout for the semi-conductor memory component module to be used in a second configuration of the semi-conductor memory component;
- the use of the first layout or the second layout for the total layout of the semi-conductor memory component, depending on the particular configuration of the semi-conductor memory component.

It is particularly advantageous that the first and second, in particular the first, second and, where necessary, any other layouts for the semi-conductor memory component module, all have essentially the same exterior dimensions.

An advantageous embodiment of the invention is one where the first and second, in particular the first, second and any further layouts for the semi-conductor memory component module are all placed at essentially the same location in the layout as a whole.

In this way a kind of "DRAM component architecture design kit" is made available, by means of which the DRAM component may—in a particular way—be variably configured: in so doing, the relevant configuration is not set only after the manufacture of the DRAM components—by means of so-called fuses or bonds, or by means of metallic options on the mask as in current technology—but rather by using particular, pre-designed layouts and/or layout blocks at the layout level (i.e. immediately before writing the—appropriately configured—mask required for manufacturing the DRAM components)—depending on the configuration required at any time—and not using other pre-designed layout and/or layout blocks dedicated to other configurations (and/or—depending on the configuration required at any time—using particular pre-designed layouts and/or layout blocks dedicated to the required configuration, with which the pre-designed layout and/or layout design blocks—dedicated to a different configuration—are substituted).

In this way specific client needs regarding the particular configuration of the DRAM components can be met shortly before the manufacture of the DRAM components, in particular shortly before the relevant mask is written.

BRIEF DESCRIPTION OF THE DRAWINGS

The invention is more closely described below by use of examplifying embodiments and the accompanying drawings. In the drawings.

DETAILED DESCRIPTION OF VARIOUS EMBODIMENTS

Figure 1:
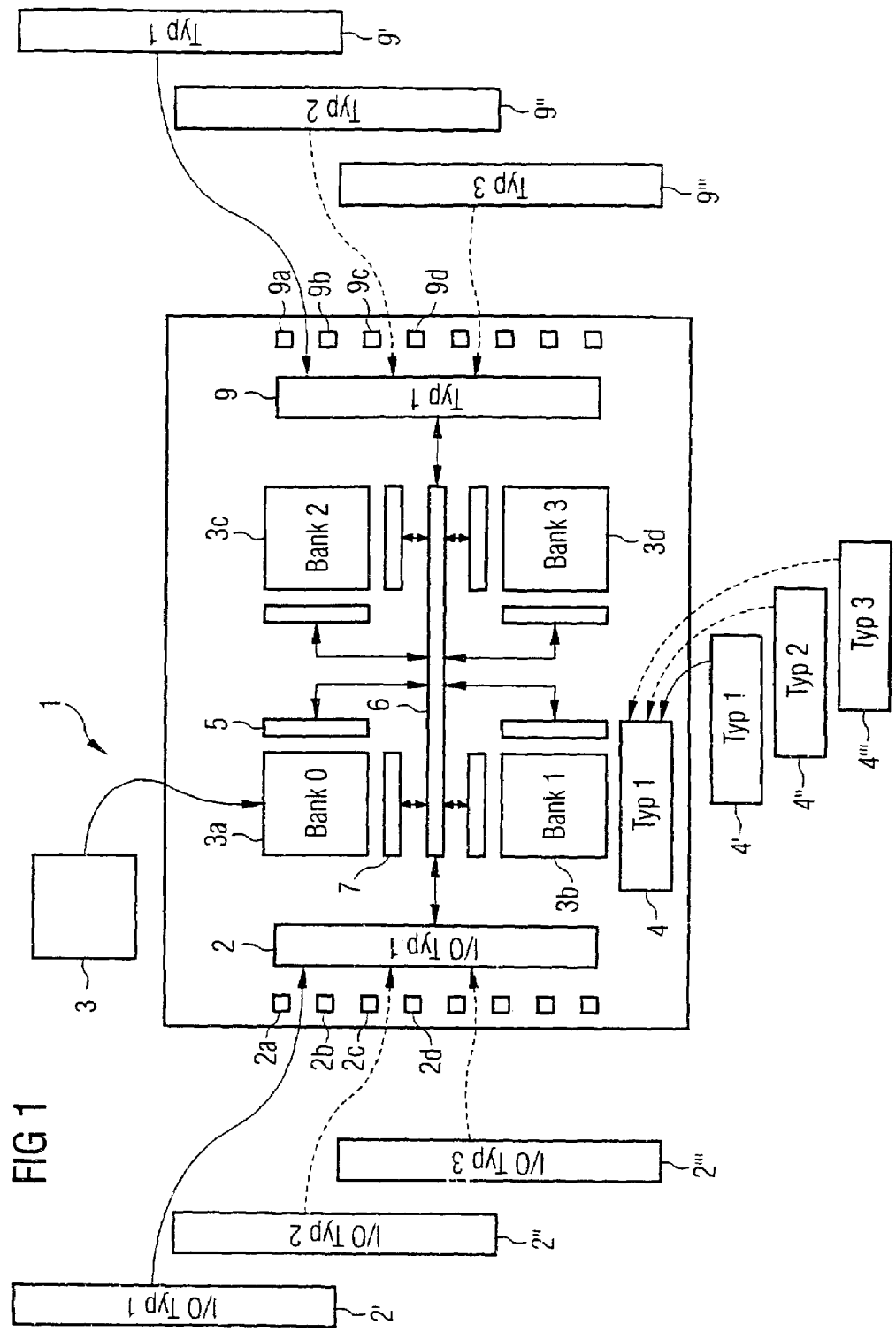
FIG. 1 shows a schematic representation of the principal construction details of a semi-conductor memory component, which has been configured according to a first variant.

In FIG. 1—for instance—a schematic representation of a semi-conductor memory component 1 and/or semi-conductor memory chip is shown, which has been or is being designed by means of a process according to an examplifying embodiment of the present invention.

The semi-conductor memory component 1, may for instance be a RAM component (RAM=Random Access Memory and/or Read-Write Memory), in particular a DRAM memory component (DRAM=Dynamic Random Access Memory and Dynamic Write-Read Memory) based on CMOS technology).

The DRAM memory component 1 can store data at a particular address and later read it out again under this address, once a corresponding address has been entered by means of address connections linked to an address input interface unit 9 and/or address input pads 9a, 9b, 9c, 9d.

A number of data connections 2a, 2b, 2c, 2d and/or data input/output pads have been provided for inputting and outputting data, here for example there are 16 data connections 2a, 2b, 2c, 2d, connected to a data input/output interface unit.

By entering a corresponding signal (i.e. a read/write-signal) to a write/read selection connection and/or pad—not shown here—it can be selected that data can at any time be stored or read out.

The data entered into the semi-conductor memory component 1 is stored there in corresponding memory cells, and later read out again from those memory cells.

Each memory cell consist of only one single, appropriately controlled capacitance (i.e. the gate source capacitance of a MOSFET), with which in the form of a charge one bit can be stored in each case.

A particular number of memory cells is arranged lying in a right-angled and/or square matrix and/or array 3a, 3b, 3c, 3d, so that for instance 32 Mbits, 64 Mbits, 128 Mbits or 256 Mbits, can be stored in an array 3a, 3b, 3c, 3d, etc. corresponding with the number of memory cells.

As further shown in FIG. 1, the semi-conductor memory component 1 displays a number k of memory cell arrays 3a, 3b, 3c, 3d, (here for example four correspondingly constructed arrays, equally distributed over the surface of the component) so that a corresponding total memory capacity i.e. 128-Mbits, 256 Mbits, 512 Mbits, or 1024 Mbits (or 1 Gbit) is created for the semi-conductor memory component 1.

The above address entered at the address connections 9a, 9b, 9c, 9d, contains a corresponding number of bits (i.e. two), that serves to address the required memory cell array 3a, 3b, 3c, 3d during the storage and/or reading out of data.

The data put out by the arrays 3a, 3b, 3c, 3d is in each case read by a data write/read logic containing for example a corresponding sense amplifier (not shown here) and relayed via a controlled logic containing for example a corresponding multiplexer and/or de-multiplexer, timer, register, etc. (not shown here) to a chip-internal data path 6 and/or data bus jointly used by all the arrays 3a, 3b, 3c, 3d; during the writing of data into the arrays 3a, 3b, 3c, 3d, the correspondingly reversed process takes place.

The address applied to the address connections 9a, 9b, 9c, 9d is relayed—for instance via the address input interface unit 9 and the data path 6 (or another additional separate data path)—to the relevant address logic provided in the corresponding array 3a, 3b, 3c, 3d, in particular to a row logic 5 containing a row decoder, and/or for instance a column logic 7 containing a column decoder, that ensure that the memory cell(s) corresponding to the required installed address required in every case is/are addressed.

As further shown in FIG. 1, the DRAM memory component 1 has been fitted with one (or several) voltage supply facilities 4—for example one containing an appropriate voltage supply circuit—through which the corresponding components are supplied with regulated voltage derived from an external voltage source.

The DRAM memory component 1 is—structurally—identical with conventional DRAM memory components, in particular with conventional DRAM memory components that are configurable with fuses or bonds.

Figure 2:
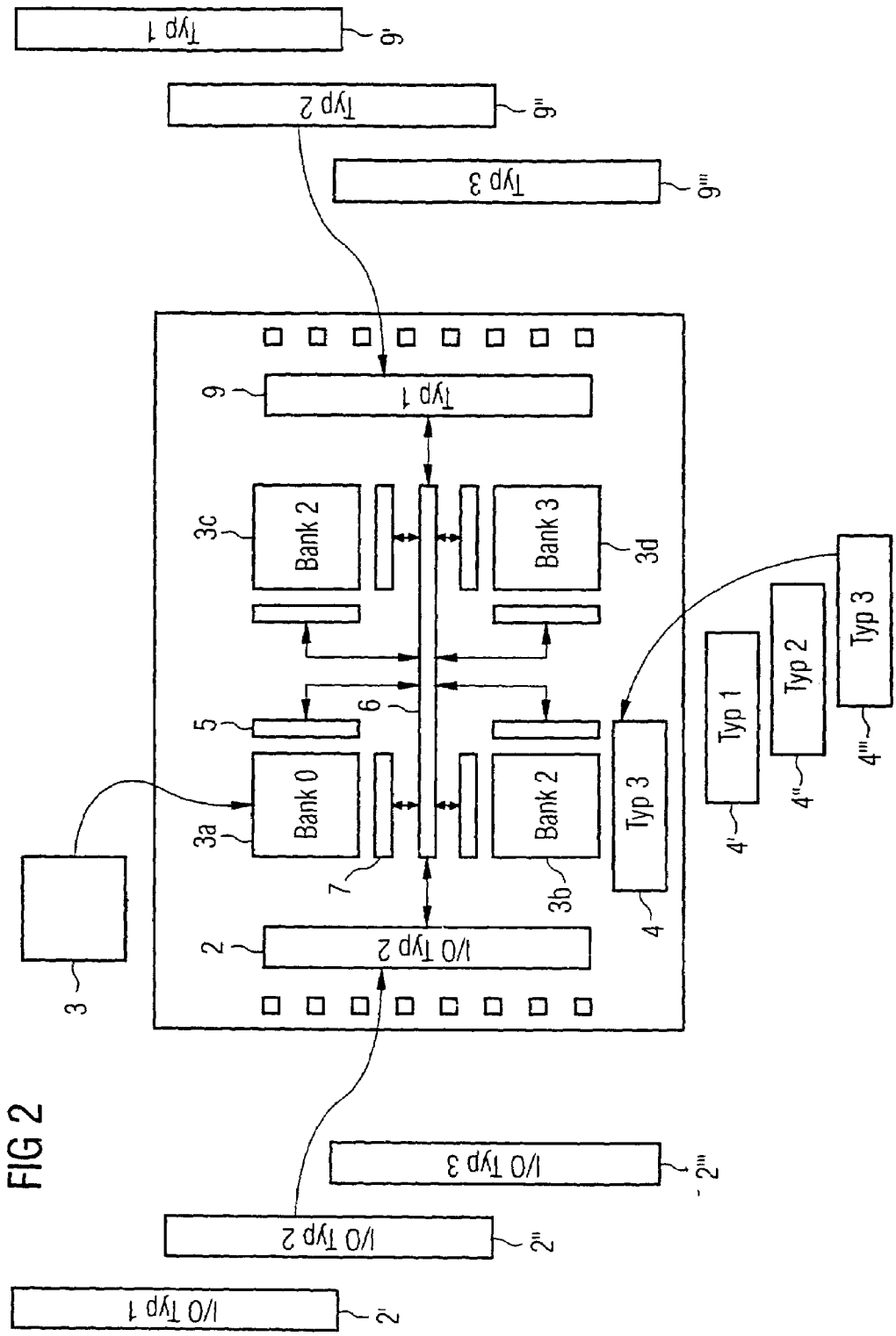
FIG. 2 shows a schematic representation of the principal construction details of semi-conductor memory component, which has been configured according to a second variant.
Figure 3:
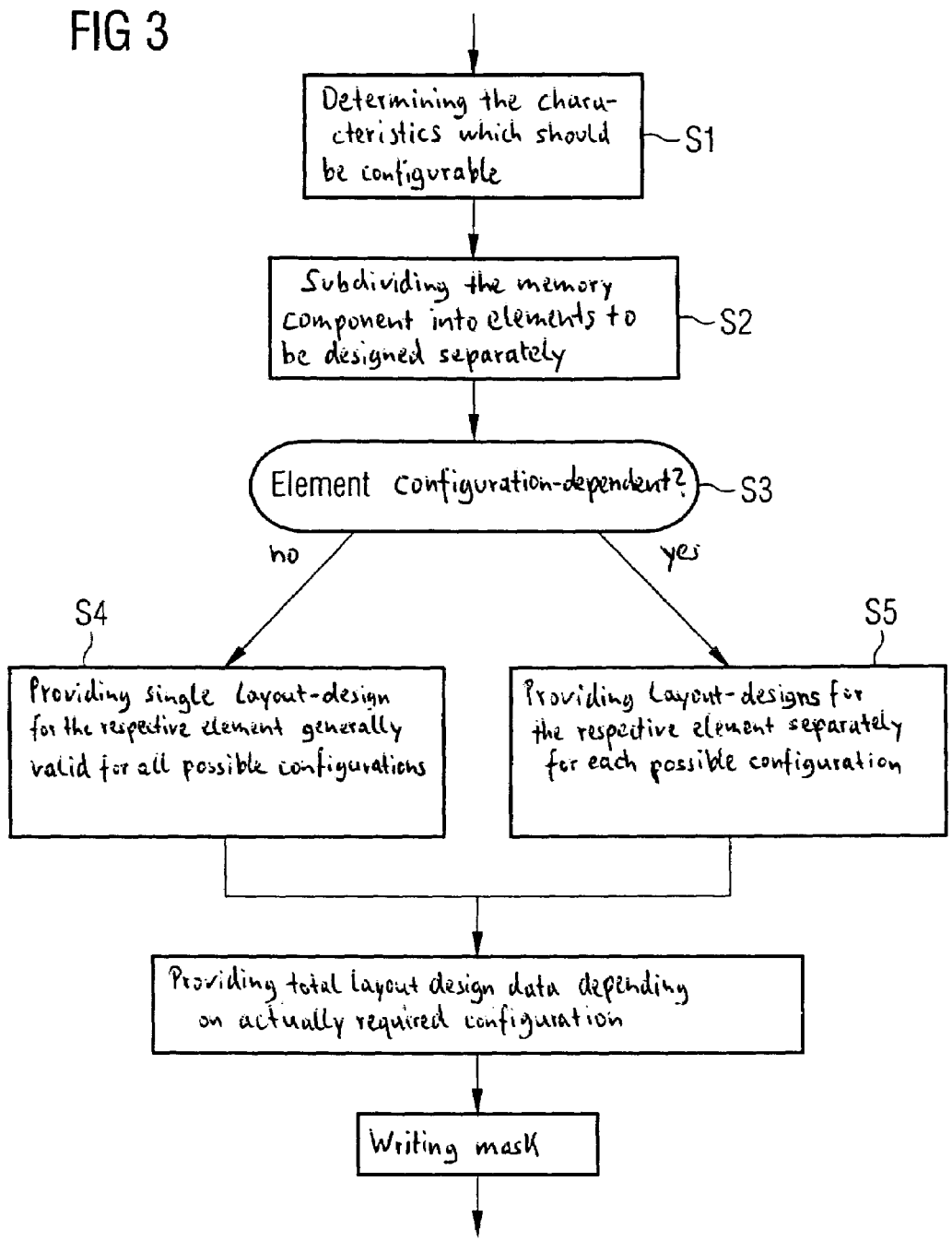
FIG. 3 shows a schematic representation of the sequence of the steps followed in the design and manufacture of the semi-conductor memory components shown in FIG. 1 and 2, according to an examplifying embodiment of the invention.

FIG. 3 shows a schematic representation of the sequence—according to an examplifying embodiment of the invention—of the process steps followed during the design and manufacture of semi-conductor memory components, in particular of the DRAM memory component shown in FIG. 1 (and/or of those shown in FIG. 2).

The DRAM-memory component 1 is—as further illustrated below—"variably configurable" (i.e. configurable by choice as SDR-DRAM, DDR-DRAM or DDR2-DRAM, and/or as a memory component with 8- or 16-bit data output, and/or as memory component with or without special optional features, i.e. with or without current saving mode), in a particular fashion, whereby the configuration of the relevant DRAM memory component (i.e. as SDR, DDR or DDR2-DRAM, etc.) is not installed —as with current technology—by means of so-called fuses or bonds after the manufacture of the DRAM memory component, or by means of metal options on the mask, but rather—as is further illustrated below—by using particular pre-designed layout blocks at layout level (i.e. immediately before writing the mask required for manufacturing the—correspondingly configured—DRAM memory component 1)—depending on the configuration required at any time—, and by not using pre-designed layout blocks dedicated to other configurations (and/or—depending on the corresponding configuration required—by replacing particular pre-designed layout blocks that are dedicated to configurations different to the required configuration by pre-designed layout blocks dedicated to the required configuration).

In this way, particular customer needs regarding the required configuration of the DRAM memory component 1 can be accommodated shortly before manufacturing the DRAM memory component 1, in particular shortly before the relevant mask is written.

As shown in FIG. 3, it is first determined during the manufacture of the DRAM memory component 1, during a first step S1, which characteristics of the DRAM memory component 1 should be configurable (in the way described above) up to shortly before writing the relevant mask—and which characteristics are fixed, i.e. not able to be configured in the above fashion (not dependent on actual immediate customer needs, but on customer needs likely to occur in the future).

For example the DRAM memory component 1 should be configurable as:

SDR-DRAM, DDR-DRAM or DDR2-DRAM memory components (option 1, option 2, option 3); and/or a memory component with 8 or 16 or 32 bit data output (option 1', option 2', option 3'); and/or a memory component with low, medium or high data and/or clock pulse rate (option 1", 2", 3"); and/or a memory component with a voltage supply according to type 1, type 2, or type 3 (option 1''', 2''', 3'''); and/or a memory component with or without special optional features (option 1'''', 2'''', 3''''), i.e. with or without current saving mode, etc.

Figure 4:
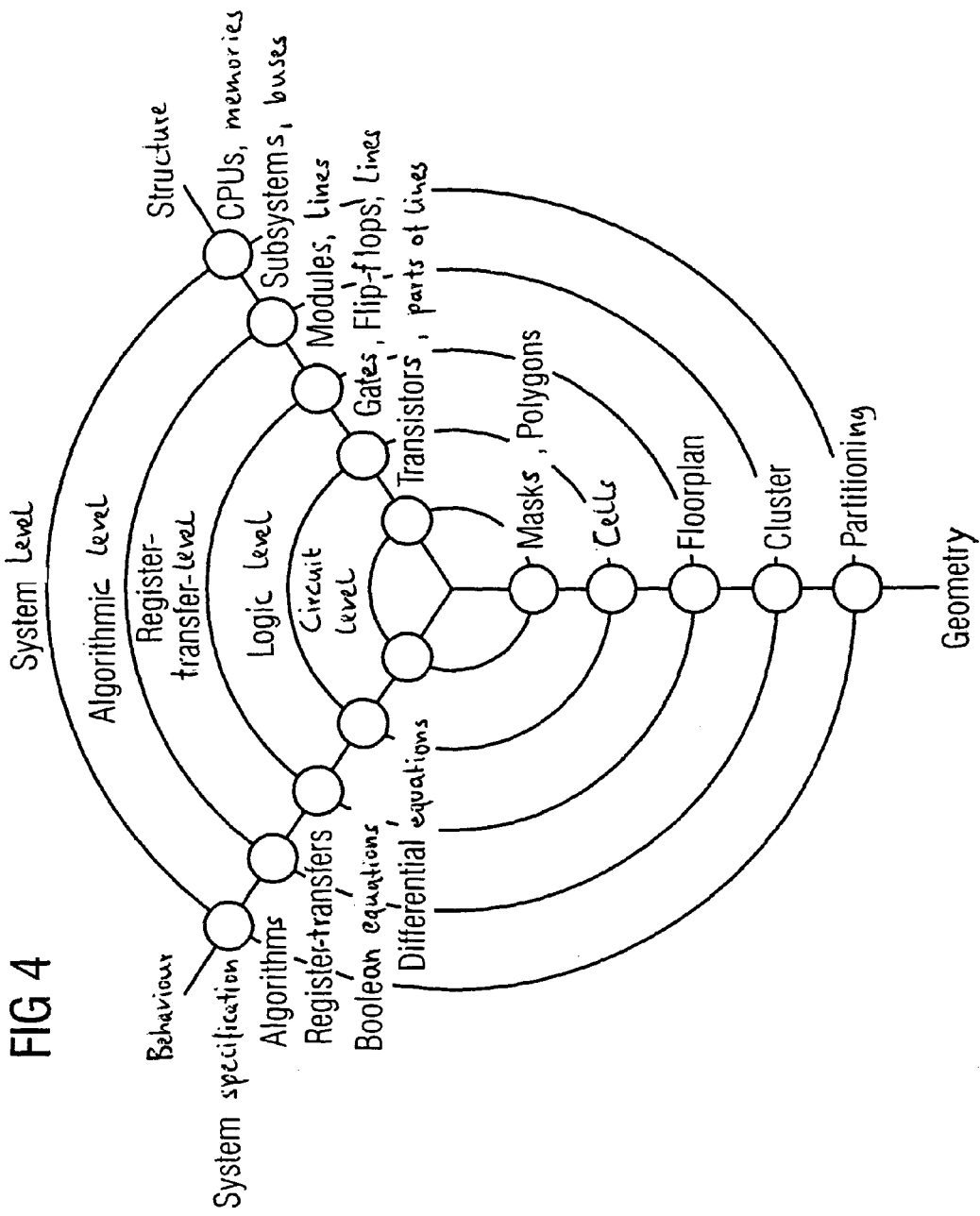
FIG. 4 shows a schematic representation of possible levels of abstraction passed through during the design of the semi-conductor memory components shown in FIG. 1 and 2.

Next, as seen in FIG. 3, during a subsequent step (step S2), i.e. at a relatively high and/or medium abstraction level of the semi-conductor component design abstraction levels shown in FIG. 4 (i.e.—functionally viewed—the system, algorithm, register transfer and or logic level, and/or—structurally viewed—i.e. the sub systems and/or module level) the DRAM memory component 1 to be designed is subdivided into individual elements to be designed separately from each other (i.e. the arrays 3a, 3b, 3c, 3d, the data input/output interface unit 2, the row logic 5, the column logic 7, the data path 6, the address input interface unit 9, the voltage supply facility(ies) 4, etc., as well, for example, the above data read-in/read-out logic shown in FIG. 1, etc.).

During the subsequent step (step S3) it is determined which of the above elements are configuration-dependent (i.e. which of the above elements must in each case be designed to be individually laid out for any or several of all the possible configurations (i.e. for various conceivable combinations of the above options, i.e. of option 1 and option 1', of option 1 and option 2', of option 2 and option 1',etc.)), and which of the above elements are not configuration-dependent (i.e. can be designed to be identically arranged for all possible configurations or conceivable optional combinations).

In the process—during the preliminary step S2—the division of the elements (and where relevant also the division of sub-elements to be designed separately) must be done in such a way that as few as possible elements (and/or as few as possible elements that are complicated to design and/or as few as possible relatively "large" elements) and/or sub-elements are configuration-dependent, and that as many as possible (and/or as many as possible elements that are complicated to design and/or as many as possible relatively "large" elements and/or sub-elements) are not configuration-dependent; in this way the total input required for designing the DRAM memory component 1 can be kept small.

Next—in the case of non-configuration-dependent elements and/or sub-elements (here i.e. the arrays 3a, 3b, 3c, 3d shown in FIG. 1, or the row and/or column logic 5, 7, etc.)—the corresponding element and/or sub-element is designed in detail down to the layout level (step S4).

In other words, a layout design generally valid for all possible configurations is made available for the relevant element and/or sub-element—i.e. according to FIG. 1 a single, generally valid array layout 3 (and/or a corresponding array layout block 3) for the arrays 3a, 3b, 3c, 3d, or a generally valid row and/or column logic layout (and/or corresponding row and/or column logic layout blocks) for example for the row and/or column logic 5, 7, etc.

For this, a conventional design process is used, i.e. a "top down", "bottom up", or other current approach. For example the design of the corresponding elements and/or sub-elements is started—in recognized fashion—at a relatively high abstraction level, whereafter the design—at increasingly lower abstraction levels—is further refined—(i.e. as shown in FIG. 4—from a functional point of view—starting from a sub-system and/or algorithm level and proceeding via a register transfer and/or logic level to a "circuit" level, etc., and/or—from a structural point of view—starting from a sub-system or module level and proceeding via a gate level to a "transistor level", etc.), until finally the exact physical layout data required for manufacturing the corresponding elements and/or sub-elements, in particular the relevant mask data, becomes available.

Here the appropriate tests and/or simulations (at each abstraction level) take place after each design step; in cause of faults, the design result must be modified and/or the particular design step repeated, or the design commenced anew at a higher level.

Standard CAD software can be used for the design and/or testing and simulation, i.e. VHDL or Verilog, SPICE, etc.

In contrast to this—and different to the above non-configuration dependent elements and/or sub-elements—for all elements and/or sub-elements that need to be differently configured—depending on the particular configuration—(here i.e. the data input/output interfaces unit 2, the data path 6, the address input/output interfaces unit 9, the voltage supply facility(ies) 4 shown in FIG. 1, etc.), the corresponding element and/or sub-element is designed in detail and individually for each possible configuration, i.e. designed repeatedly in detail (in other words, for each particular element and/or sub-element (separately for that particular DRAM memory component configuration) several dedicated layout designs are made available—i.e. according to FIG. 1 for the data input/output interfaces unit 2, three different data input/output interface unit layouts 2', 2'', 2'''

(and/or corresponding data input/output interfaces unit layout blocks 2', 2", 2'"), correspondingly dedicated to different configurations; for the voltage supply facility 4, three different voltage supply facility layouts 4', 4", 4'" (and/or corresponding voltage supply facility layout blocks 4', 4", 4'"), correspondingly allocated to different configurations, for the address input/output interfaces unit 9 three different address input/output interfaces unit layouts 9', 9", 9'" (and/or corresponding address input/output interface unit layout blocks 9', 9", 9'"), etc., correspondingly allocated to different configurations (step S5).

At the same time—as illustrated above—a conventional design process, i.e. a "top down", "bottom up" or other current procedure, is used. For instance—in a recognized fashion—i.e. at a relatively high abstraction level, a start is made with the design of the corresponding elements and/or sub-elements, which is subsequently further refined according to the design—at increasingly lower abstraction levels (i.e. as shown in FIG. 4—from a functional point of view—starting from a sub-system and/or algorithm level and proceeding via a register transfer and/or logic level to a "circuit level", etc., and/or—from a structural point of view—from a sub-system or module level via a gate level to a "transistor level", etc.), until finally the exact physical layout data, in particular the relevant mask data required for manufacturing the corresponding elements and/or sub-elements is made available.

In the process and as described above, after each of the design steps corresponding tests and/or simulations are per-formed (at each abstraction level); in case of faults the design result must be modified and/or the corresponding design step repeated, or the design commenced anew at a higher level.

During the above step S2—as illustrated in FIGS. 1 and 2—each element and/or sub-element (irrespective of the particular configuration for which the corresponding element and/or sub-element has been designed) is always dedicated to a specific—in terms of location and size—pre-determined area on the DRAM-memory component (whereby the interface behavior of the corresponding element and/or sub-elements must be closely defined and adhered to during the above design process in relation to the other elements and/or sub-elements, i.e. also during the above step S2).

Depending on the particular customer's actually required configuration, the total layout design data is then made available (according to step S6, FIG. 3).

For this—depending on the configuration required at any time—the configuration-dependent layout blocks dedicated to the corresponding configuration are used (i.e. for the configuration shown in FIG. 1 the first data input/output interface unit layout Block 2', the first voltage supply facility layout Block 4', the first address input interface unit layout Block 9', etc.; and for the configuration shown in FIG. 2, the second data input/output interface unit layout Block 2", the third voltage supply facility layout Block 4'", the second address input interface unit layout Block 9", etc.), as well as all non-configuration-specific layout blocks 3 that are identical for all configurations.

By means of the total layout assembled in this way (and/or based on the total layout and/or mask data assembled in this way) the corresponding mask is then written, with which a DRAM memory component 1—correspondingly configured—is then manufactured.

In this way particular customer needs regarding the required configuration of the DRAM—memory component 1 can be accommodated up to shortly before the manufacture of the DRAM memory component 1, in particular, up to shortly before writing the corresponding mask.

As each of the above individual layout blocks is always only used for a single configuration, the total complexity of the DRAM memory component 1 is smaller than with conventional DRAM memory components that are configured by means of fuses or bonds.

In an alternative embodiment example, one or more of the above layouts and/or layout blocks 2', 2", 2'", 4', 4", 4'", 9', 9", 9'", 3—dedicated to the above elements and/or sub-elements—can later be again used for designing further semi-conductor memory components that differ from the DRAM memory components 1, 2 shown in FIG. 1 and 2 (similar or dissimilarly structured), in particular DRAM-memory components (e.g. one or more of the above configuration-dependent layout blocks, and/or one or more of the above configuration-independent layout blocks, e.g. only one, or more of the layout and/or layout blocks etc., that are dedicated—depending on the configuration—to a particular element and/or sub-element).

The total layout design data for the above further semi-conductor memory component and/or further DRAM memory component is then made available—as described above—based for instance exclusively on re-used, or on re-used and on re-designed layout blocks (where required, depending on the particular configuration required by the customer).

In this way the above further semi-conductor memory component and/or further DRAM memory component can be designed faster and with less input than conventional semi-conductor memory components and/or DRAM memory components.

I claim:

1. A process for designing semi-conductor memory components comprising:
    designing of a first layout for a semi-conductor memory module of the semi-conductor memory component to be used for a first configuration of the semi-conductor memory component;
    designing of a second layout for the semi-conductor memory module to be used for a second configuration of the semi-conductor memory component, the second layout being different from the first layout;
    using the first layout or the second layout for a total layout of the semi-conductor memory component, depending on the particular configuration of the semi-conductor memory component selected from said first or second configurations, together with at least one further layout for at least one further semi-conductor memory module of the semi-conductor memory component that is identical and not dependent on the particular configuration of the semi-conductor memory component,
    wherein the first and second layouts for the semi-conductor memory module have essentially the same external dimensions and are arranged at the same locality of the total layout.

2. A process according to claim 1, in which the process comprises the following additional steps:
    designing of a third layout for the semi-conductor memory component module to be used for a third configuration of the semi-conductor memory component;
    using of the first, second or third layout for the total layout of the semi-conductor memory components, depending on the particular configuration of the semi-conductor memory component.

3. A process according to claim 2, wherein the first, second and third layouts for the semi-conductor memory component module all have essentially the same exterior dimensions.

4. A process according to claim 2, wherein the first, second and third layouts for the semi-conductor memory component module are all essentially arranged at the same locality of the total layout.

5. A process according to claim 1, in which the process additionally comprises the following steps:
designing the at least one further layout for the at least one further semi-conductor memory module of the semi-conductor memory component.

6. A process according to claim 1, in which the semi-conductor memory component is a RAM component.

7. A process according to claim 6, in which the semi-conductor memory component is a DRAM component.

8. A process according to claim 7, in which the structure of the DRAM component is essentially identical, as with DRAM components configurable by means of fuses or bonds.

9. A process according to claim 1, in which the module is allocated to a relatively high and/or medium semi-conductor component design abstraction level, in particular to a sub-system, algorithm, register transfer, logic and/or module level.

10. A process according to claim 9, in which the module is not allocated to the highest semi-conductor component design abstraction level, in particular not to the system and/or CPU/memory level.

11. A process according to claim 1, which produces a total layout for an SDR-DRAM or DDR-DRAM and/or a DDR2-DRAM component, corresponding with the particular semi-conductor memory component configuration selected in each case.

12. A process according to claim 1, which produces corresponding with the particular semi-conductor memory component configuration selected in each case a total layout for a semi-conductor memory component with a number of data output bits corresponding with the particular configuration.

13. A process according to claim 1, which produces corresponding with the particular semi-conductor memory component configuration selected in each case a total layout for a semi-conductor memory component with a data and/or clock pulse rate corresponding with the particular configuration.

14. A process according to claim 1, which produces corresponding with the particular semi-conductor memory component configuration selected in each case a total layout for a semi-conductor memory component with a voltage supply designed in accordance with the particular configuration.

* * * * *